(12) United States Patent
Lee et al.

(10) Patent No.: US 9,053,648 B1
(45) Date of Patent: Jun. 9, 2015

(54) TILED DISPLAYS USING MULTIPLE DISPLAY PANELS OVER MONOLITHIC BACKLIGHT MODULES

(71) Applicant: Google Inc., Mountain View, CA (US)

(72) Inventors: Johnny Lee, Mountain View, CA (US); Eric Teller, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 169 days.

(21) Appl. No.: 13/754,750

(22) Filed: Jan. 30, 2013

Related U.S. Application Data

(66) Substitute for application No. 61/636,458, filed on Apr. 20, 2012.

(51) Int. Cl.
*G09F 13/04* (2006.01)
*G02B 27/02* (2006.01)
*H05K 13/00* (2006.01)

(52) U.S. Cl.
CPC .............. *G09F 13/04* (2013.01); *G02B 27/027* (2013.01); *H05K 13/0023* (2013.01)

(58) Field of Classification Search
CPC ...................... G09G 2320/0646; G09G 3/3406
USPC ........... 362/97.1–97.3, 227, 234, 235, 249.01
See application file for complete search history.

(56) References Cited

U.S. PATENT DOCUMENTS

| | | | |
|---|---|---|---|
| 5,661,531 A | 8/1997 | Greene et al. | |
| 5,838,405 A | 11/1998 | Izumi et al. | |
| 6,014,232 A | 1/2000 | Clarke | |
| 6,483,482 B1 | 11/2002 | Kim | |
| 6,881,946 B2 | 4/2005 | Cok et al. | |
| 7,145,611 B2 | 12/2006 | Dubin et al. | |
| 7,443,463 B2 | 10/2008 | Chang et al. | |
| 7,667,815 B2 | 2/2010 | Su | |
| 8,643,949 B2 | 2/2014 | Seo et al. | |
| 8,836,896 B2 | 9/2014 | Park et al. | |
| 2002/0008809 A1 | 1/2002 | Babuka et al. | |
| 2002/0080302 A1 | 6/2002 | Dubin et al. | |
| 2003/0071566 A1 | 4/2003 | Kwasnick et al. | |
| 2006/0077544 A1 | 4/2006 | Stark | |
| 2007/0279367 A1 | 12/2007 | Kitai | |
| 2009/0168399 A1 * | 7/2009 | Kim et al. | 362/84 |

FOREIGN PATENT DOCUMENTS

| | | |
|---|---|---|
| EP | 2306437 A1 | 4/2011 |
| EP | 2312378 A1 | 4/2011 |
| TW | 201030696 A | 8/2010 |
| WO | WO 98/43131 | 10/1998 |
| WO | WO 02/01284 A1 | 1/2002 |
| WO | WO 02/42838 A1 | 5/2002 |

\* cited by examiner

*Primary Examiner* — Vip Patel
(74) *Attorney, Agent, or Firm* — Blakely Sokoloff Taylor & Zafman LLP

(57) ABSTRACT

A modular display including a monolithic backlight module to generate light and a plurality of display panels disposed over the monolithic backlight module, and tiled such that each display panel abuts another display panel along at least one edge thereof to form a seam. Each display panel includes a light modulation layer disposed adjacent to the monolithic backlight module to modulate the lamp light received from a first side and to output a display image from a second side, and seam-concealing optics disposed over the second side of the light modulation layer. Other embodiments are disclosed and claimed.

19 Claims, 8 Drawing Sheets ated Embodiments

TILED DISPLAYS USING MULTIPLE DISPLAY PANELS OVER MONOLITHIC BACKLIGHT MODULES

CROSS-REFERENCE TO RELATED APPLICATIONS

This application claims priority under 35 U.S.C. §119(e) to U.S. Provisional Patent Application No. 61/636,458, filed 20 Apr. 2012. The priority provisional application is hereby incorporated by reference in its entirety.

TECHNICAL FIELD

Embodiments of the present invention relate generally to displays and in particular, but not exclusively, to displays using multiple tiled display panels over a monolithic backlight module.

BACKGROUND

Large wall displays can be prohibitively expensive because the cost to manufacture display panels increases exponentially with display area. This cost increase arises from the increased complexity of large monolithic displays, the decreased yields associated with large displays (a greater number of components must be defect free for large displays), and increased shipping, delivery, and setup costs. Tiling smaller display panels to form larger multi-panel displays can help reduce many of the costs associated with large monolithic displays.

FIGS. 1A-1B illustrate how tiling multiple smaller, less expensive display panels 100 together can achieve a large multi-panel display 105 that can be used as a large wall display. The individual images displayed by each display panel 100 can constitute a sub-portion of the larger overall composite image collectively displayed by multi-panel display 105. Multi-panel display 105 can reduce costs, but visually it has a major drawback. Each display panel 100 includes its own backlight module and includes a bezel 110 around its periphery that houses pixel region 115 in which the display pixels are disposed. Manufacturers have recently reduced the thickness of bezel 110 considerably, to less than 2 mm, but even these thin bezels are very noticeable to the naked eye, meaning that they distract the viewer and otherwise detract from the overall visual experience.

Various other approaches for obtaining seamless displays include display lensing, blended projection, stackable display cubes, and LED tiles. Display lensing places a single contiguous lens in front of each display panel 100 to present a fused, borderless image in a particular "sweet spot." However, the viewing angle is relative narrow and image distortion along continuous lines still occurs. Blended projection uses software stitching and mechanical mounting of traditional projection screens. Currently, blended projection uses relatively low cost hardware and is a good option for non-planar surfaces. However, there are significant physical constraints on usage and installation and requires regular maintenance and sophisticated calibration. Stackable display cubes are a rear projection technology. Each display cube is relatively deep and the seams between adjacent cubes are easily visible. LED tiles are arrays of discrete RGB light emitting diodes ("LED"). LED tiles can have virtually invisible seams because the seams run between pixels. However, LED tiles are expensive and have large pixel pitches (e.g., 2 to 4 mm) that result in low resolution images.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments are described of an apparatus, system, and method for displays using tiled display panels over monolithic backlight modules. Numerous specific details are described to provide a thorough understanding of embodiments of the invention, but one skilled in the relevant art will recognize that the invention can be practiced without one or more of the specific details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
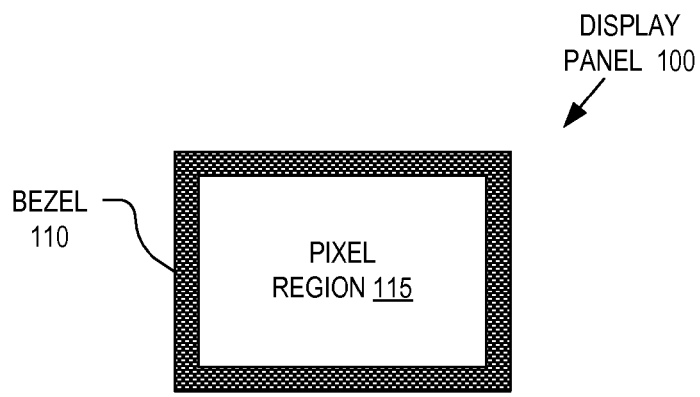
FIGS. 1A-1B are plan views of an embodiment of a tiled display panels.
Figure 1B:
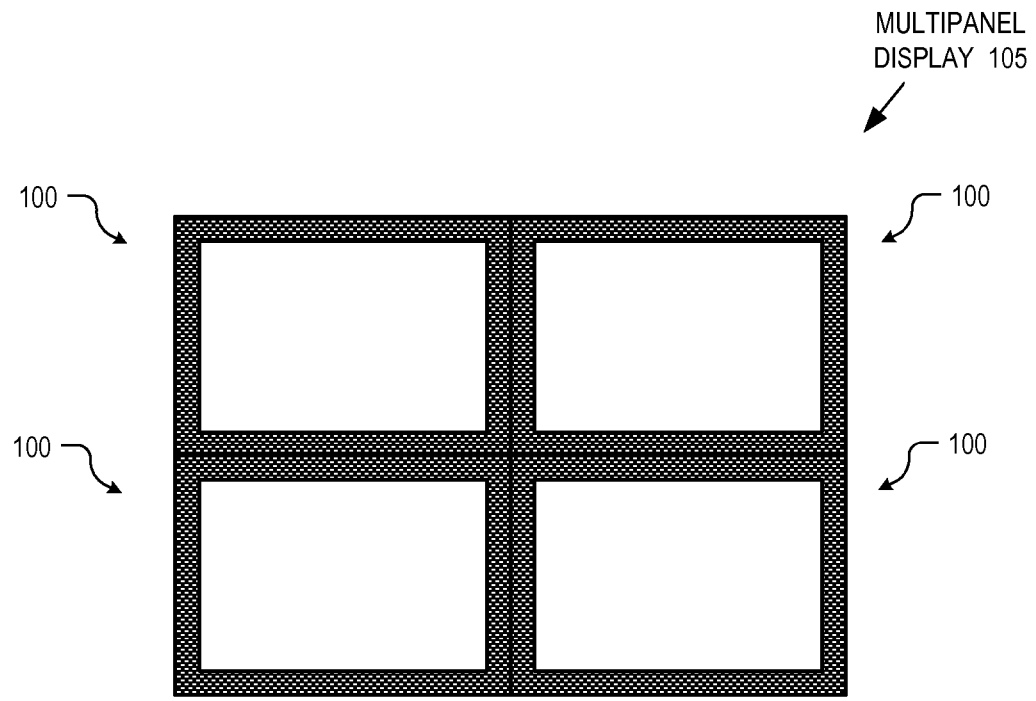
Figure 2A:
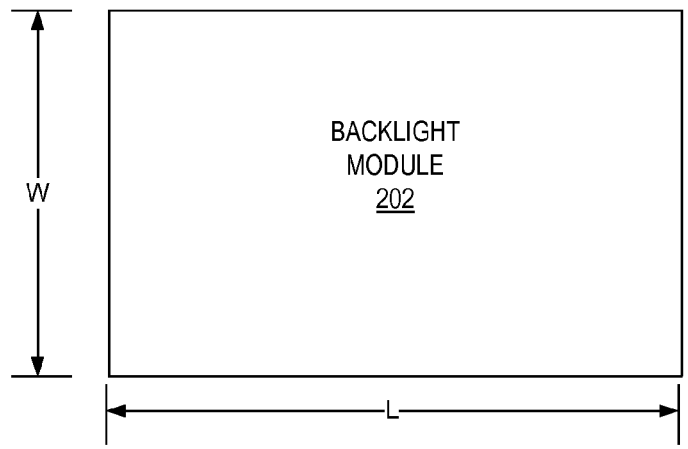
FIGS. 2A-2B are plan views of an embodiment of a display including tiled display panels over a monolithic backlight module.

FIG. 2A illustrates a monolithic backlight module 202. In the illustrated embodiment, backlight module 202 is a one piece module (hence the term "monolithic") having a quadrilateral shape with length L and width W. In different embodiments, length L and width W can be set to any value, depending on the size desired for the resulting tiled multi-panel display. Similarly, in other embodiments monolithic backlight module 204 can have other shapes (see, e.g., FIG. 5).

Figure 2B:
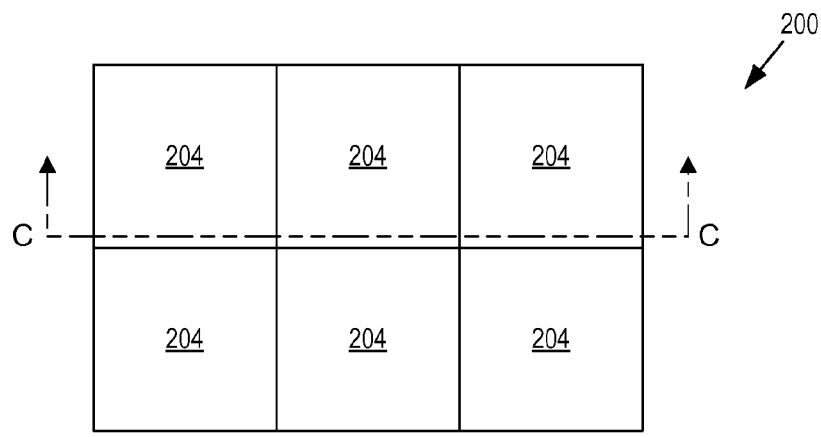
Figure 2C:
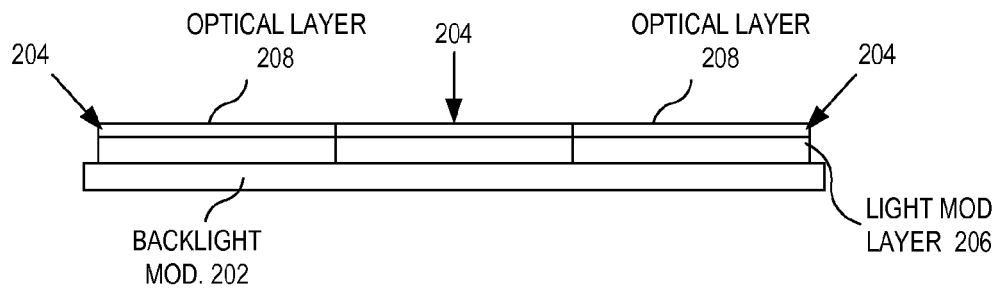
FIG. 2C is a cross-section of the display shown in FIG. 2B, taken substantially along section line C-C.

FIGS. 2B-2C together illustrate an embodiment of a configurable multi-panel display 200 using tiled display panels 204 of the same size placed over a monolithic backlight module 202. Tiled multi-panel display 200 includes a plurality of display panels 204 tiled over monolithic backlight module 202, such that at least one edge of each display panel 204 abets an edge of an adjacent display panel to form a seam in the tiled display. When positioned together over backlight module 202, the display panels 204 form a tiled multi-panel display. In the illustrated embodiment, the display panels, when tiled, have the same overall size and shape as the monolithic backlight module 202. In other embodiments, the overall size and shape of the tiled multi-panel display need not match the size and shape of the monolithic backlight module (see, e.g., FIG. 3A), and individual display panels 204 need not all have the same shape (see, e.g., FIG. 3B).

Each display panel 204 includes a light modulation layer 206 and an optical layer 208. Light modulation layer 206 is positioned on monolithic backlight module 204 and modulates light originating from the backlight module to create the image seen by the user of tiled multi-panel display 200. In one embodiment light modulation layer 206 can be implemented using LCD technology, but in other embodiments other technologies can be used.

Optical layer 208 conditions light exiting from light modulation layer 206, for example by magnifying it or collimating it, and can, instead or in addition, be used to conceal seams between individual display panels 204. In the illustrated embodiment optical layer 820 overlays the entire display, but in other embodiments it need not. For example, in embodiments where the function of optical layer 208 is only seam concealment, the optical layer can be positioned only over the seams and surrounding areas. Optical layer 208.

Power efficiency and reduced manufacturing costs may be achieved using monolithic backlights, since lamps and power supplies can be shared over a larger area. In contrast, manufacturing costs may be reduced by using smaller repeated display panels 204, which use a pixel structure that is repeated on a per pixel basis, regardless of the size of each display panel 204. Reducing the size of display panels 204 can achieve higher manufacturing yields and reduced costs.

Figure 3A:
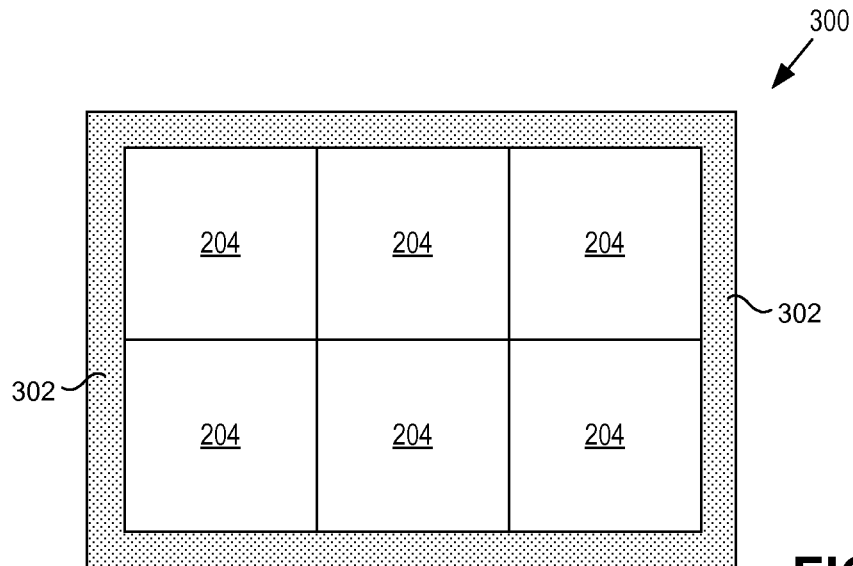
FIGS. 3A-3B are plan views of additional embodiments of displays including tiled display panels over a monolithic backlight module.
Figure 3B:
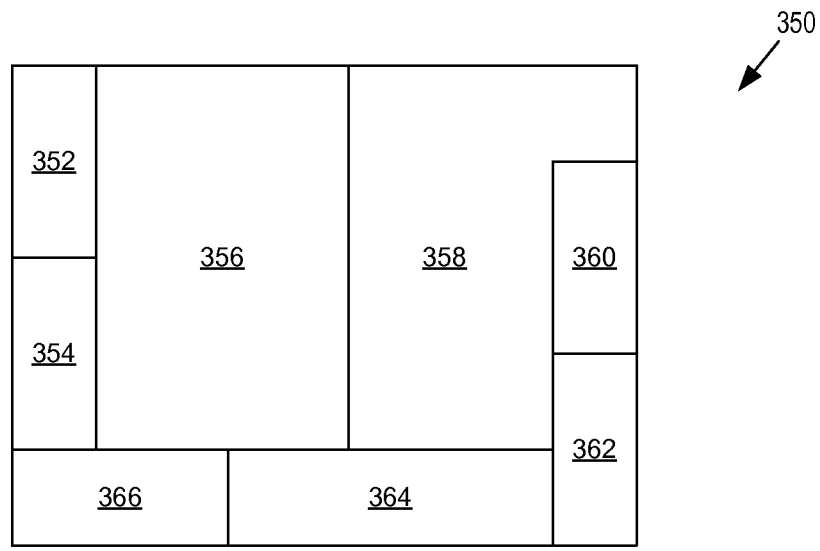

FIGS. 3A-3B illustrate alternative embodiments of a tiled multi-panel display on a monolithic backlight module. FIG. 3A illustrates a display 300 that is in most respects similar to display 200: it includes a quadrilateral monolithic backlight module and a plurality of individual quadrilateral display panels 204 tiled on the backlight panel. The principal difference is that in monolithic backlight panel 300 the size of the monolithic backlight module differs from the overall size of the tiled display panels. In the illustrated embodiment, the size of the monolithic backlight module exceeds the size of the tiled display panels, such that a border 302 results around the tiled display panels. In one embodiment, border 302 can be left plain (e.g., uncovered) so that display 300 will have a lighted border surrounding the tiled display panels. In other embodiments, border 302 can be covered with an opaque, transparent or translucent cover. For example, border 302 could be covered with a colored transparent or translucent cover to give display 300 a decorative glowing colored border.

FIG. 3B illustrates an embodiment of a tiled multi-panel display 350 that is in most respects similar to embodiment 200: it includes a quadrilateral monolithic backlight module with multiple individual display panels tiled on it, such that the overall size and shape of the tiled display panels substantially matches the size and shape of the backlight module. The primary difference is that in tiled multi-panel display 350 the individual display panels need not be all of the same size and shape. The display can include some individual display panels that are of the same size and shape, such as display panels 352 and 354, but can also include panels that are of different sizes, such as panel 364 and panel 356. Display 350 can also include non-quadrilateral panels such as panel 358. In other embodiments other individual display panel shapes can be used, such as regular or irregular polygon or non-polygon shapes.

Figure 4:
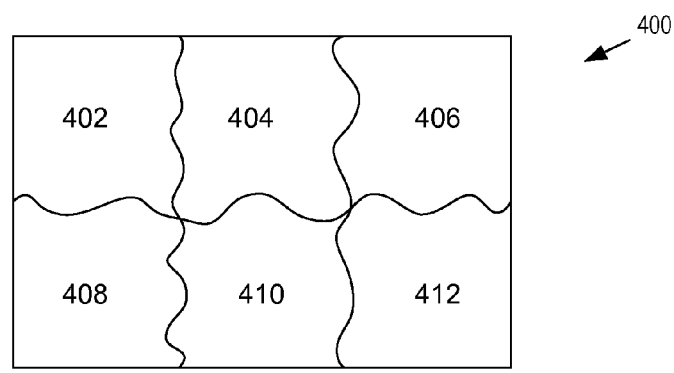
FIG. 4 is a plan view of another embodiment of a display using tiled display panels over a monolithic backlight module.

FIG. 4 illustrates an alternative embodiment of a tiled multi-panel display 400 that is in most respects similar to display 200: it includes a quadrilateral monolithic backlight panel with individual display panels tiled on it such that the overall size and shape of the tiled display panels substantially matches the size and shape of the monolithic backlight module. The primary difference in display 400 is that the individual display panels 402-406 need not have linear edges. In the illustrated embodiment, each individual display panel 402-406 includes linear (e.g., straight) edges and nonlinear edges (e.g., regular or irregular curved edges). In the illustrated embodiment the nonlinear edges are irregular and/or random, but in other embodiments they can be regular but curved edges.

For example, individual display panel 402 has two linear edges that coincide with edges of the monolithic backlight module, an irregular nonlinear edge where panel 402 abuts panel 404, and another irregular nonlinear edge where panel 402 abuts panel 408. In display panel, the irregular nonlinear edges are complementary with the edge of the display panel that will abut along that edge so that the edges can meet to form a narrow seam. Thus, in the illustrated embodiment the irregular nonlinear edge of panel 402 that abuts panel 404 is complementary to the irregular nonlinear edge of panel 404 that abuts panel 402. Other embodiments of display 400 can include display panels all of whose edges are nonlinear. For example, in a tiling of display panels that include interior panels not aligned along the edge of the monolithic backlight module, all the edges of those interior panels can be nonlinear. In still other embodiments, the light modulation layers of the individual display panels can have straight edges while the corresponding optical layer can be implemented as a layer with irregular edges that mate with irregular edges of adjacent optical layers. The irregular edges of the optical layers operate to randomize the seams between adjacent display panels to make the seams less apparent.

Figure 5:
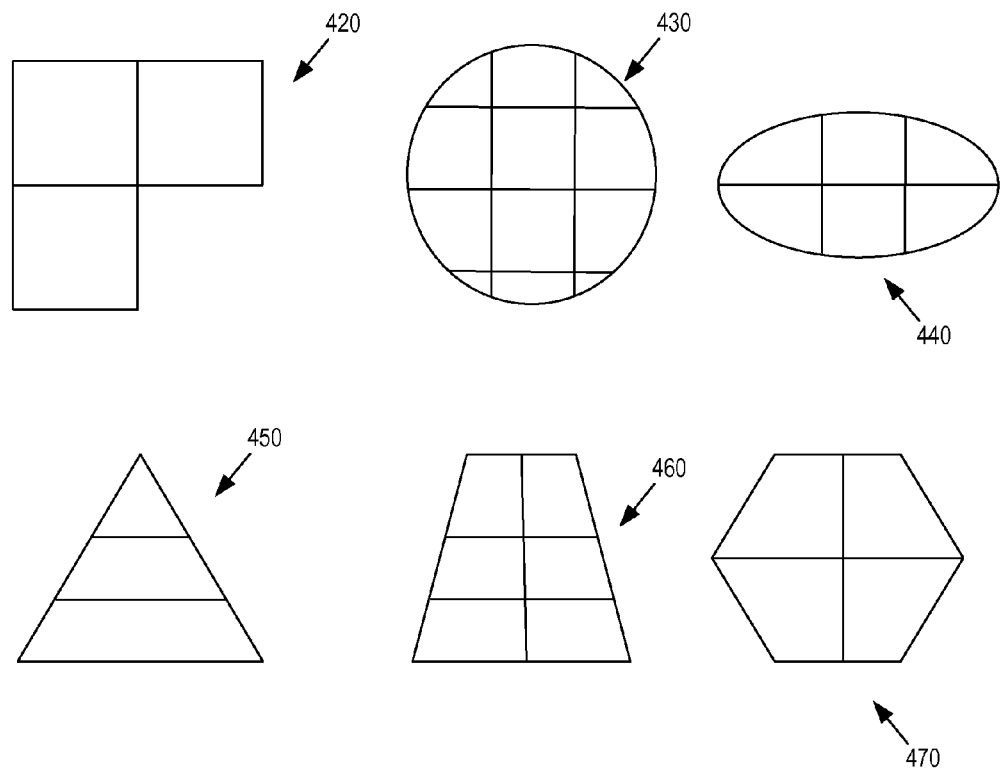
FIG. 5 shows plan views of embodiments of monolithic backlight modules having different shapes.

FIG. 5 illustrates embodiments of monolithic backlight module shapes. In previously-described embodiments, the backlight module was regular and quadrilateral, but that need not be the case in every embodiment. In one embodiment, for example, the backlight module could be a regular polygon such as the quadrilaterals already shown or such as triangle 450, a trapezoid 460, or a hexagon 470. In other embodiments the shape of the backlight module can be an irregular polygon such as polygon 420, and in still other embodiments the monolithic backlight module can be a non-polygon shape such as circle 430, or ellipse 440. The described shapes are, of course, a non-exhaustive list: the monolithic backlight module could also have shapes not illustrated or listed or shown. When the monolithic backlight module has a non-polygon shape such as circle 430 or ellipse 440, the individual display panels that are tiled on that monolithic backlight module can include straight and curved edges, as shown in the illustrated embodiments, and in other embodiments can also include irregular nonlinear edges such as those shown for display 400.

Figure 6A:
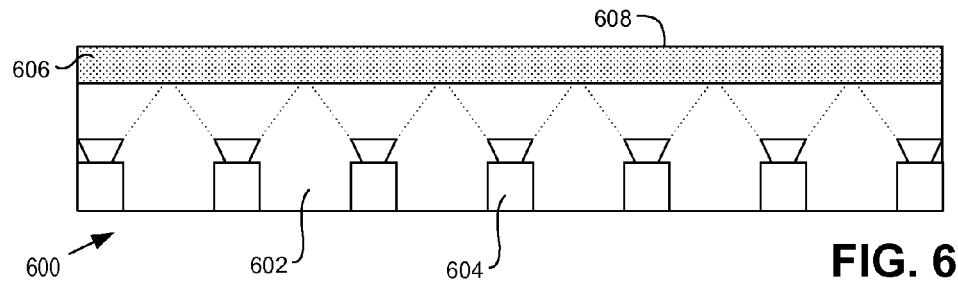
FIGS. 6A-6D are cross-sections of embodiments of monolithic backlight modules.

FIGS. 6A-6D illustrate embodiments of monolithic backlight modules. FIG. 6A illustrates a monolithic backlight module 600 including a housing 602 within which are positioned multiple light sources 604. Light sources 604 are positioned such that they point toward surface 608, which is the surface of backlight module 600 on which individual display panels will be tiled, and thus direct light through the display panels. In one embodiment light sources 604 can be light emitting diodes (LEDs), but in other embodiments they can be other types of light sources, and in still other embodiments they can be a mixture of different types of light sources. A diffuser 606, such as a translucent panel, can be positioned between light sources 604 and surface 608 to make the light directed through the tiled display panels more uniform.

Figure 6B:
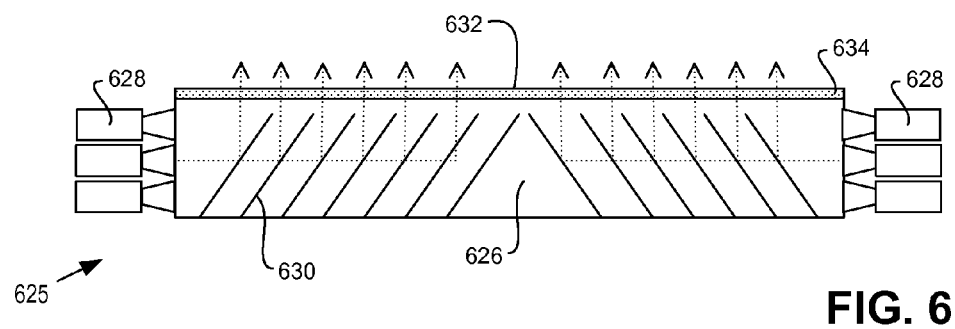

FIG. 6B illustrates another embodiment of a monolithic backlight module 625. Backlight module 625 includes a housing 626. Light sources 628 are positioned on at least one edge of the housing, pointing inward toward the interior of housing 626. Light sources 628 can be light emitting diodes (LEDs) in one embodiment, but in other embodiments can be other types of light sources or mixtures of light sources. An optical structure 630 is positioned in housing 626 to redirect light from light sources 628 toward surface 632 on which on which display panels will be tiled. In one embodiment, optical structure 630 can be an optical grating, but in other embodiments it can be another type of optical structure, such as an array of partially reflective mirrors, an array of beam splitters, or some other type of optical structure. A diffuser 634, such as a translucent panel, can be positioned between optical structure 630 and surface 632 to make the light that will be directed through the tiled display more uniform.

Figure 6C:
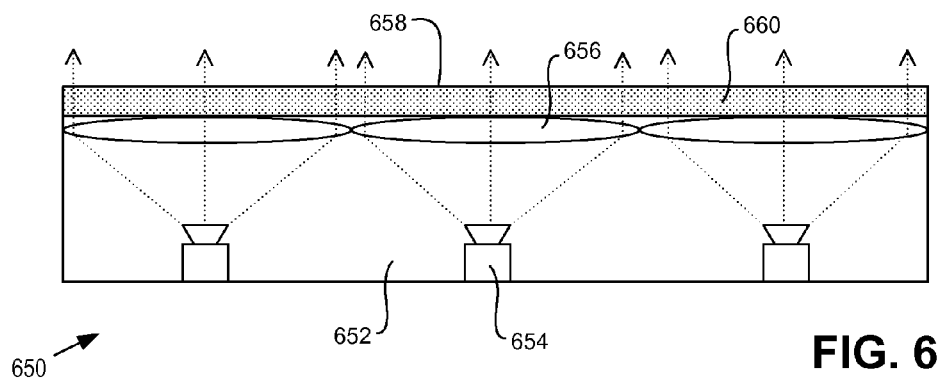
Figure 6D:
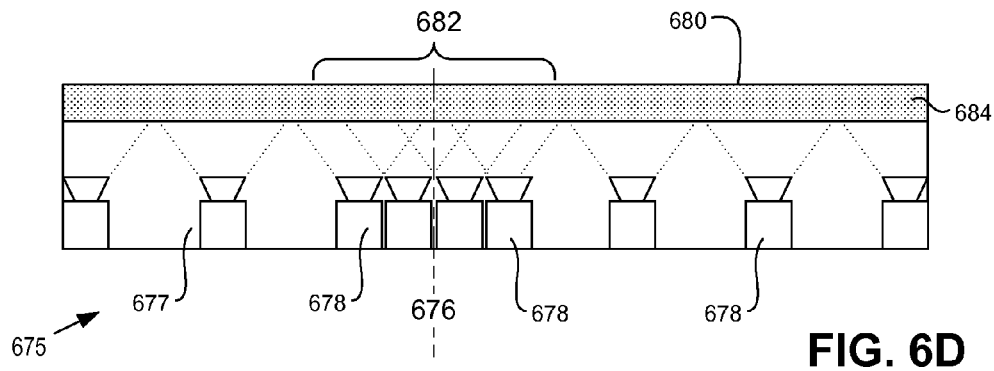

FIG. 6C illustrates another embodiment of a monolithic backlight module 650. Backlight module 650 includes high-intensity light sources 654 positioned within housing 652 and pointing toward surface 658 on which display panels can be tiled. In one embodiment high-intensity light sources 654 can be lasers, but in other embodiments they can be other types of high-intensity light sources or mixtures of high-intensity light sources. Each high-intensity light source 654 is optically coupled to a collimating lens 656 that collimates light from the high-intensity light source and directs it toward surface 658 so that it can pass through the tiled display panels. As with other embodiments a diffuser 660, such as a translucent panel, can be inserted between collimating lenses 656 and surface 658 to make the light directed through the display panels more uniform.

FIG. 6B illustrates another embodiment of a monolithic backlight module 675. Backlight module 675 includes a housing 677 within which are positioned multiple light sources 678 pointing toward surface 680 on which individual display panels can be tiled. In backlight module 675, light sources 678 are grouped closer together near seams, for example to account for seam-concealing optics that can reduce the intensity of the light output near the seams of the tiled multi-panel display. Thus, if in the illustrated embodiment a seam in the tiled display panels substantially coincides with line 676, light sources 678 can be grouped closer together about line 676 to produce a region 682 of higher-intensity light than would exist with the uniformly-spaced light sources of backlight module 600. As with the other backlight modules a diffuser 684, such as a translucent panel, can be positioned between light sources 678 and surface 680 to improve the uniformity of light that will be directed through the tiled display panels.

Figure 7A:
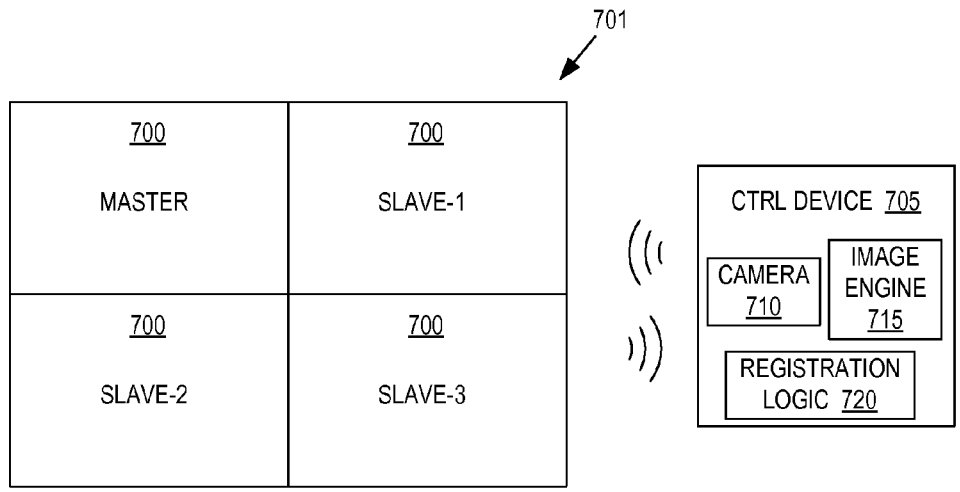
FIGS. 7A-7B illustrate embodiments of communication protocols for displaying a composite image across multiple tiles of a tiled multi-panel display.
Figure 7B:
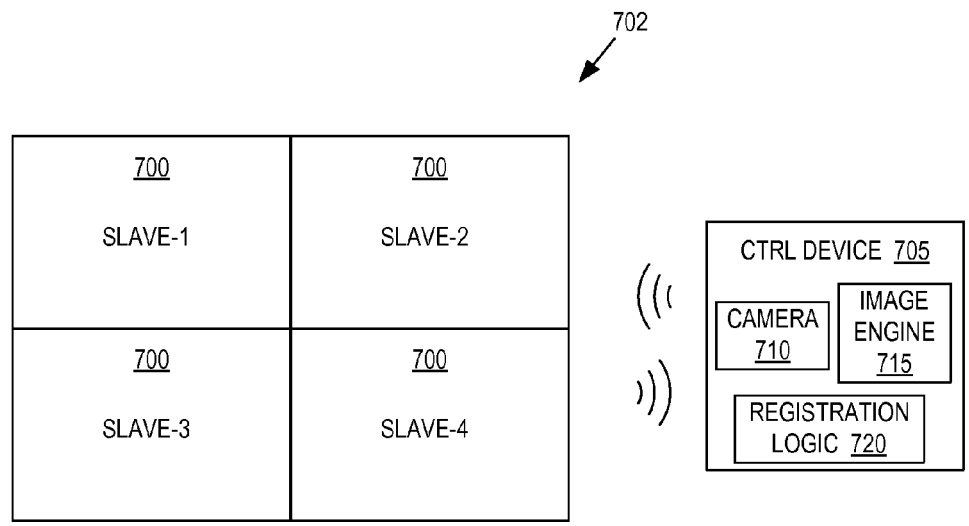

FIGS. 7A-7B illustrate embodiments of communication protocols for displaying a composite image across multiple display panels of a tiled multi-panel display 701. Tiled multi-panel display 701 can be any of the tiled multi-panel displays described herein. FIG. 7A illustrates a technique where one display panel 700 operates as a master and the remaining display panels 700 operate as slaves that communicate with the master. The master device can be identical to the other slave devices, but merely designated as a master during operation. For example, the master device can be the first display panel 700 logically added to the multi-panel display 701. As new display panels 700 are added or existing display panels 700 removed, the master display panel 700 can be responsible tracking and assigning display statuses and roles. In another embodiment, the master device can include additional interface electronics (e.g., wireless transceiver) not included in the other slave display panels 700 for communicating with a control device 705. The control device 705 can communicate display images and control information with the master display panel 700, which then relays the appropriate portions of the display images to the respective slave display panels 700. FIG. 7B illustrates a more distributed protocol where all display panels 700 are identical and operate as slave devices controlled directly by control device 705. Various registration markers can be used to identify and distinguish the various display panels 700. For example, magnetic bits, RFID, optical markers, active links, or various bus interfaces and signaling protocols can be used.

The illustrated embodiment of control device 705 includes a camera 710, an image engine 715, and registration logic 720. In one embodiment, control device 705 can be implemented with a smart phone having a general purpose processor, a built-in camera, and wireless interface electronics (e.g., WiFi or Bluetooth transceivers). The wireless interface electronics can be used to stream the composite image to display panels 700. Operation of control device 705 to set up and configure multi-panel displays 701 or 702 is discussed in further detail in connection with FIG. 9.

FIGS. 8A-8D illustrate embodiments of techniques for implementing intelligent reformatting/reconfiguration of a display image when an individual display tile is added or removed from a multi-panel display 800. Tiled multi-panel display 800 can be any of the tiled multi-panel displays described herein. When panels are added to or removed from multi-panel display 800, the remaining display panels 801 can be intelligently reconfigured to effectively use the resulting display area. Intelligent reconfiguration can include adjusting image resolution or switching between a complex display interface for large composite display areas, and a simplified display interface for small composite displays (i.e., when the display area rises above or drops below a threshold size).

Figure 8A:
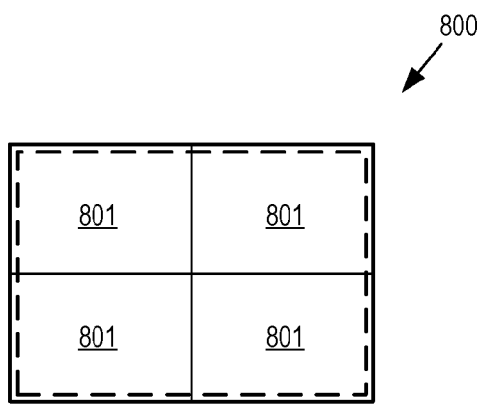
FIGS. 8A-8D illustrate embodiments of techniques for implementing intelligent reformatting/reconfiguration of a display image when an individual display tile is added to or removed from a tiled multi-panel display.
Figure 8B:
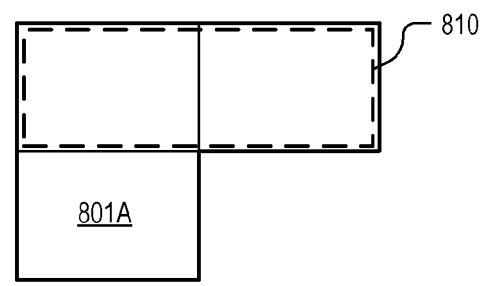
Figure 8C:
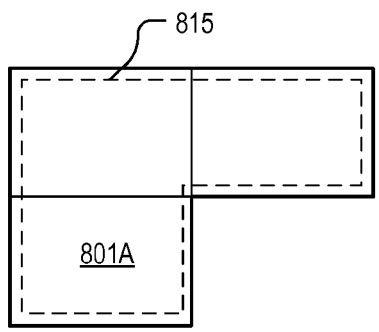
Figure 8D:
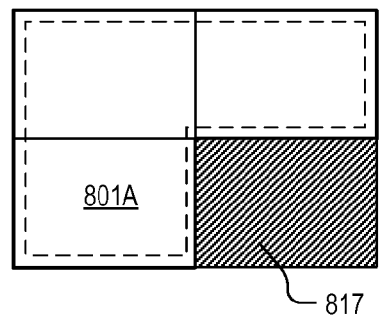

FIGS. 8B-8D illustrate configuration options when the addition or removal of a display panel 801 results in an irregularly-shaped display area. In FIG. 8B, the display panel 801A forming the irregular shape is unused and the display image reverts to the largest available rectangular shaped area 810. In FIG. 8C, display panel 801A is used and the display image follows the irregular shaped area 815. FIG. 8D illustrates a configuration in which the removed display panel 801 is replaced with a non-display panel 817 of the same fixed size that can be put into the gap left behind by the removed display panel. This could be done for aesthetic reasons or for structural reasons, for example to support the passing of control logic or power to other panels in the display, etc.

Figure 9:
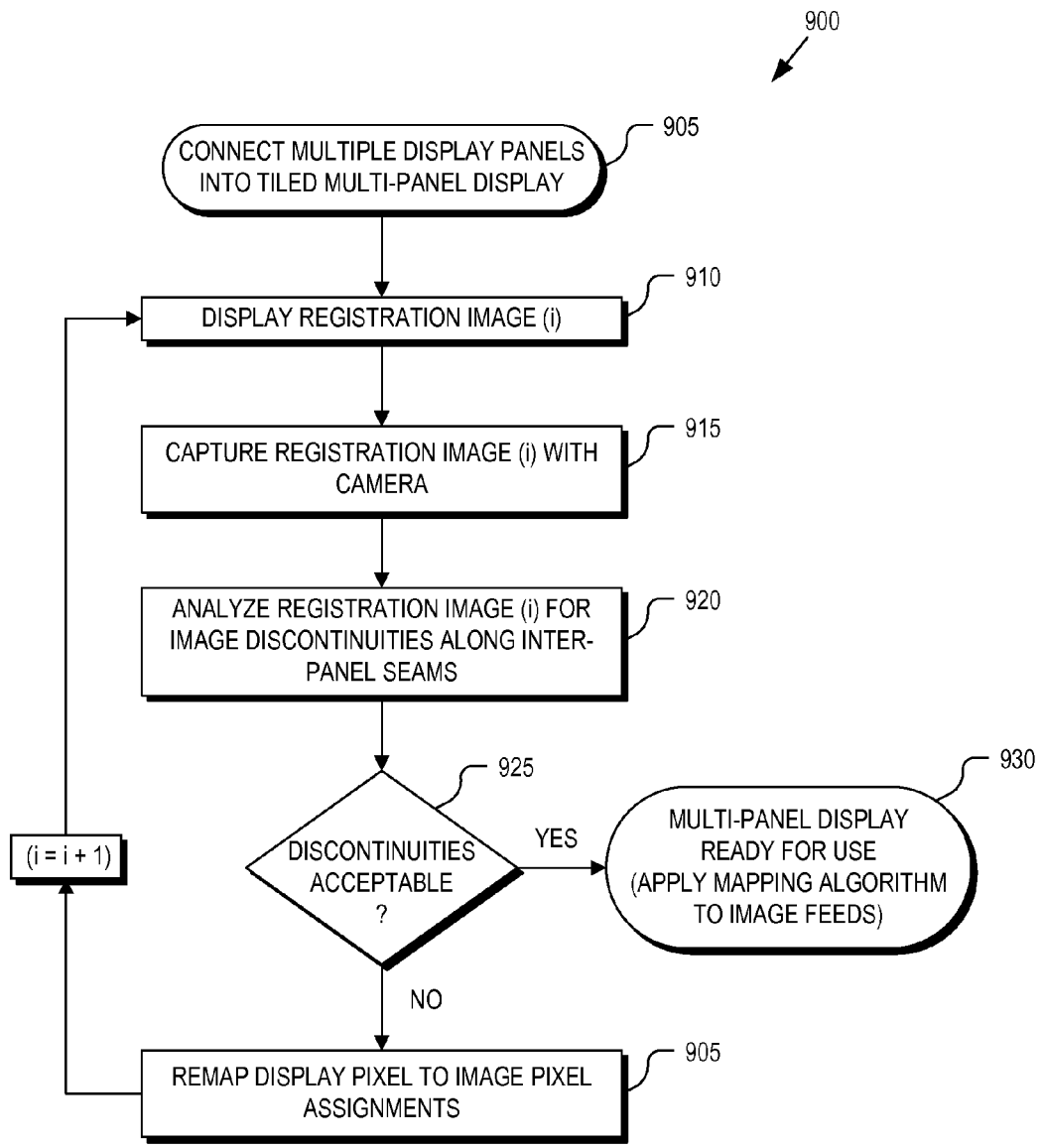
FIG. 9 illustrates an embodiment of a process for image registration to cure misalignments between connected display tiles of a tiled multi-panel display.

FIG. 9 illustrates an embodiment of a process 900 for image registration to cure misalignments between display tiles of a multi-panel display. Process 900 is described with reference to FIG. 7A. The order in which some or all of the process blocks appear in process 900 should not be deemed limiting. Rather, one of ordinary skill in the art having the benefit of the present disclosure will understand that some of the process blocks can be executed in a variety of orders not illustrated, or even in parallel.

When coupling two or more display panels 700 together, perfect physical alignment may not be achieved, or the display panel can include intentionally randomized pixels that do not perfectly align. Process 900 identifies misalignments or image discontinuities along the seams of a tiled multi-panel display (or within an interior region of the display panel) and remaps display pixel to image pixel assignments to cure the defects.

In a process block 905, two or more display panels 700 are coupled together to form a tiled multi-panel display 701. As previously stated, this coupling can result in one or more image discontinuities along the inter-panel seams. To cure these defects, image engine 715 generates an initial registration image i (e.g., i=1) for transmission to display panels 700. In one embodiment, registration image i is an alternating high contrast image (e.g., black and white checkerboard image) that provides several identifiable marks along the seam edges of each display panel 700 or displays a full screen image that provides enough information to recover the full position and orientation of each panel relative to one another.

In a process block 915, camera 710 is used to capture registration image i output from multi-panel display 701. The captured registration image i is then analyzed by registration logic 720 to identify any misalignment between panels (process block 920). If the misalignment is determined to be unacceptable (decision block 925), then registration logic 720 adjusts the display pixel to image pixel mapping in an attempt to cure the discontinuities or at least reduce the number of image discontinuities. With the pixel assignments remapped, process 900 loops back to process block 910 and can iterate by redisplaying a revised registration image i. The registration iterations can continue until the alignment is determined to be within acceptable limits (decision block 925), at which time multi-panel display 701 is ready for use. Alternatively, this software alignment can be computed from a single calibration image. The remapped display pixel to image pixel assignments are maintained and used for all image feeds until the next recalibration cycle.

In some embodiments, the image registration technique described for FIG. 9 can further be used to smooth out other image discontinuities between the tiled panels than just physical misalignment of the display panels and their fibers. For example, the image registration technique can be used to adjust brightness, color temperature, etc. between the display panels to achieve uniform image characteristics and avoid perceived image characteristic boundaries between the tiled panels. Feedback from the displayed registration images can be used to adjust and smooth these differences. The image registration technique can even be used to smooth differences between individual pixels within a given display panel, if the underlying display permits such pixel-to-pixel adjustments.

The processes explained above are described in terms of computer software and hardware. The techniques described can constitute machine-executable instructions embodied within a tangible or non-transitory machine (e.g., computer) readable storage medium, that when executed by a machine will cause the machine to perform the operations described. A tangible machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.). Additionally, the processes can be embodied within hardware, such as an application specific integrated circuit ("ASIC") or otherwise.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A modular display comprising:
a monolithic backlight module to generate light;
a plurality of display panels disposed over the monolithic backlight module, and tiled such that each display panel abuts another display panel along at least one edge thereof to form a seam, each display panel including:
a light modulation layer disposed adjacent to the monolithic backlight module to modulate the lamp light received from a first side and to output a display image from a second side; and
seam-concealing optics disposed over the second side of the light modulation layer.

2. The modular display of claim 1 wherein the seam-concealing optics comprise an optical expansion layer disposed over the second side of the light modulation layer to expand the display image to an area larger than the light modulation layer to conceal bezel seams between light modulation layers of adjacent display panels.

3. The modular display of claim 1 wherein at least one of the plurality of display panels includes a non-linear edge that mates with a corresponding non-linear edges of an adjacent display panel.

4. The modular display of claim 1 wherein the plurality of tiled display panels matched the monolithic backlight module in size, shape, or both size and shape.

5. The modular display of claim 1 wherein each of the plurality of display panels has the same shape.

6. The modular display of claim 1 wherein each of the plurality of display panels has a polygonal shape.

7. The modular display of claim 1 wherein the monolithic backlight module comprises a plurality of light sources pointed toward the plurality of display panels.

8. The modular display of claim 7 wherein the spacing between light sources decreases near a seam.

9. The modular display of claim 1 wherein the monolithic backlight module comprises:
a plurality of light sources positioned along at least one edge of the backlight module; and
an optical structure within the backlight module to redirect light from the plurality of light sources toward the plurality of display panels.

10. The modular display of claim 1 wherein the monolithic backlight module comprises:
collimating optics to direct collimated light toward the plurality of display panels; and
a plurality of high-intensity light sources optically coupled to the collimating optics.

11. The modular display of claim 1 wherein the size of the monolithic backlight panel exceeds the size of the tiled display panels.

12. The modular display of claim 1 wherein the monolithic backlight panel has a polygonal shape.

13. A process for forming a modular display, the process comprising:
   providing a monolithic backlight module to generate light;
   tiling a plurality of display panels over the monolithic backlight module, such that each display panel abuts another display panel along at least one edge thereof to form a seam, each display panel including:
      a light modulation layer disposed adjacent to the monolithic backlight module to modulate the lamp light received from a first side and to output a display image from a second side; and
      seam-concealing optics disposed over the second side of the light modulation layer.

14. The process of claim 13 wherein the seam-concealing optics comprise an optical expansion layer disposed over the second side of the light modulation layer to expand the display image to an area larger than the light modulation layer to conceal bezel seams between light modulation layers of adjacent display panels.

15. The process of claim 13 wherein at least one of the plurality of display panels includes a non-linear edge that mates with a corresponding non-linear edges of an adjacent display panel.

16. The process of claim 13 wherein the monolithic backlight module comprises a plurality of light sources pointed toward the plurality of display panels.

17. The process of claim 16, further comprising decreasing the spacing between light sources decreases a seam.

18. The process of claim 13 wherein the monolithic backlight module comprises:
   a plurality of light sources positioned along at least one edge of the backlight module; and
   an optical structure within the backlight module to redirect light from the plurality of light sources toward the plurality of display panels.

19. The process of claim 13 wherein the monolithic backlight module comprises:
   collimating optics to direct collimated light toward the plurality of display panels; and
   a plurality of high-intensity light sources optically coupled to the collimating optics.

* * * * *